United States Patent [11] 3,602,985

[72] Inventor Edwin Nosch
Heilbronn, Germany
[21] Appl. No. 862,775
[22] Filed Oct. 1, 1969
[45] Patented Sept. 7, 1971
[73] Assignee Telefunken Patentverwertungsgesellschaft m.b.H.
Ulm, Danube, Germany
[32] Priority Oct. 1, 1968
[33] Germany
[31] P 18 00 192.8

[54] METHOD OF PRODUCING SEMICONDUCTOR DEVICES

12 Claims, 4 Drawing Figs.

[52] U.S. Cl. .......... 29/588, 29/589
[51] Int. Cl. .......... B01j 17/00, H01l 1/10
[50] Field of Search .......... 29/588, 589, 576 S, 191 E; 174/E

[56] References Cited

UNITED STATES PATENTS

| | | | |
|---|---|---|---|
| 3,171,187 | 3/1965 | Lkeda et al. | 29/588 UX |
| 3,436,201 | 4/1969 | Tsuji et al. | 29/588 X |
| 3,447,236 | 6/1969 | Hatcher | 29/589 X |
| 3,494,022 | 2/1970 | Maute | 29/588 X |

*Primary Examiner*—John F. Campbell
*Assistant Examiner*—W. Tupman
*Attorney*—Spencer & Kaye

ABSTRACT: A method of producing semiconductor devices comprising securing contacts onto tongues or rungs of contact-making strips, inverting housing members onto the contacts, placing a semiconductor body on each of the contacts and introducing second contacts on tongues or rungs of a contact-making strip into the housing members to connect them to the semiconductor bodies. The device is completed by heat treatment of the housing to attach it to the contacts and parting the tongues or rungs from their contact-making strip.

Inventor:
Edwin Nosch
BY Spencer & Kaye
ATTORNEYS.

Inventor:
Edwin Nosch
BY Spencer & Kaye
ATTORNEYS.

METHOD OF PRODUCING SEMICONDUCTOR DEVICES

BACKGROUND OF THE INVENTION

The present invention relates to a method of producing and making contact to semiconductor devices, particularly diodes. The new method is particularly suitably for the manufacture of diodes which consist of a disc-shaped semiconductor body which contains a plane PN junction extending parallel to the surface of the semiconductor. In order to improve the heat dissipation, such diodes are connected, at the two opposite surfaces of the semiconductor body, to heat sinks which merge into the lead-in wires. Hitherto, diode arrangements, particularly coaxial diode arrangements, have been known with double-sided heat dissipation, the heat being drawn off through a thickening of the lead-in wire at the contact points to the semiconductor body.

SUMMARY OF THE INVENTION

It is an object of the present invention to provide a simple method of manufacturing diodes and like semiconductor components, the electrodes of which are constructed in the form of heat sinks, for example, at both sides of the semiconductor body.

According to the invention there is provided a method of producing semiconductor devices, comprising the steps of securing first contacts in series to tongues or rungs of a contact-making strip, inverting housing members over said contacts and providing a semiconductor body on each said contact in said housing members, and finally introducing a second contact, which is secured to a further portion of a contact-making strip, into each said housing member to connecting to said second contact to said semiconductor body.

BRIEF DESCRIPTION OF THE DRAWINGS

The invention will be described in greater detail, by way of example with reference to the accompanying drawings, in which.

DESCRIPTION OF THE PREFERRED EMBODIMENT

Figure 1:
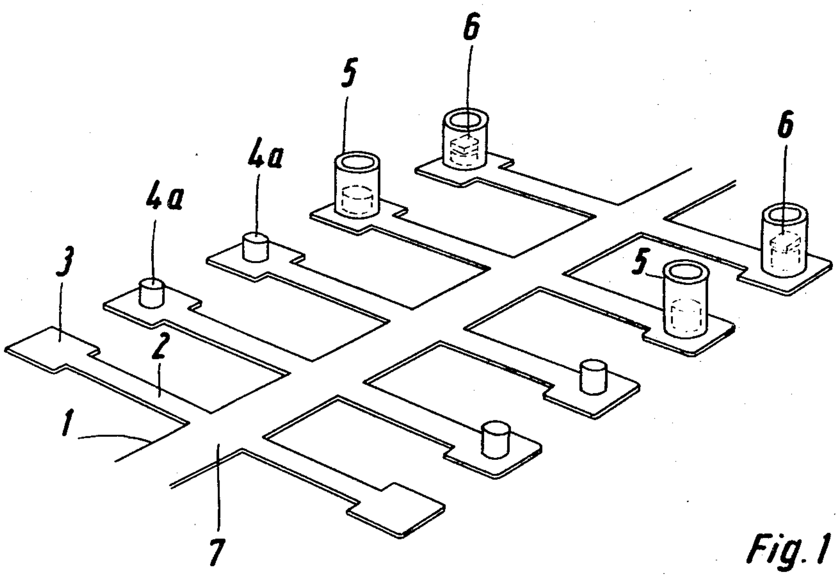
FIG. 1 shows a contact-making strip, on which various phases of manufacture are illustrated.

FIG. 1 shows a contact-making strip 1 with a double comb structure. A plurality of tongues 2 originate from a continuous web 7 in both directions and widen out to form a flat portion 3 at their free ends. The web 7, the tongues 2 and the widened portions of the tongues 3 are made in the form of flat strip. The contact-making strip 1 consists, for example, of nickel-plated or gold-plated sheet iron, Kovar Vacon, a metal compound which can be welded satisfactorily and is a good conductor, or of gold-plated sheet nickel, and is produced by stamping or etching.

Cylindrical contacts 4*a*, which consist of short lengths of wire for example, are welded on to the widened portions 3 of the tongues 2. A copper-sheathed wire with an iron-nickel core is suitable as material for the contacts, for example. Glass tubes 5 are inverted over the welded-on contacts 4*a* as housing members. The internal diameter of the glass tubes 5 is selected to be as large as or slightly larger than the diameter of the contacts 4*a* and contacts 4*b* (FIG. 12). Each glass member is about twice as long as the contact 4*a* welded on to the contact-making strip. Following on this, a semiconductor chip 6 is placed on each contact 4*a* in the housing member 5. If it is a question of a semiconductor body which contains a plane PN junction extending parallel to the surface of the semiconductor, then ohmic contact is made to the one region of the semiconductor component by the contact 4*a*.

Figure 2:
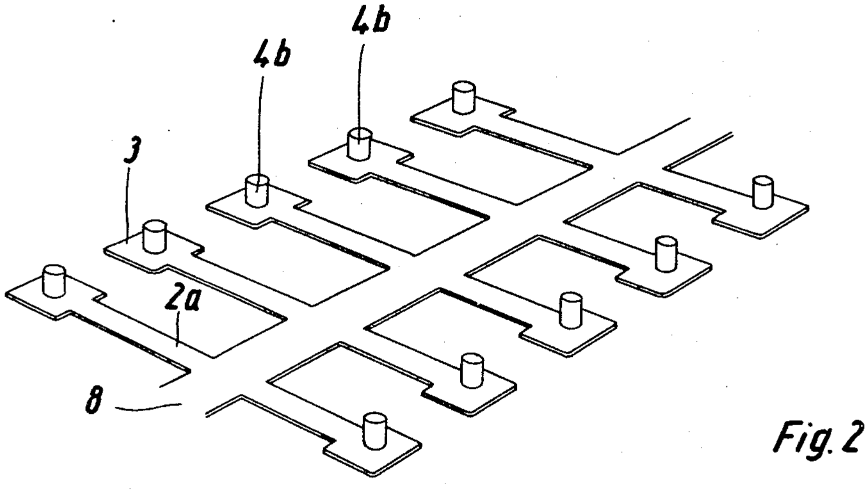
FIG. 2 shows a second contact-making strip which is equipped exclusively with contacts.

FIG. 2 illustrates a second contact-making strip 8 which has the same shape as the contact-making strip illustrated in FIG. 1. A contact 4*b* is welded on to each of the widened portions 3 of the tongues 2*a* originating from the common web of the contact-making strip, the contact having the same geometrical dimensions as the contacts 4*a* illustrated in FIG. 1.

Figure 3:
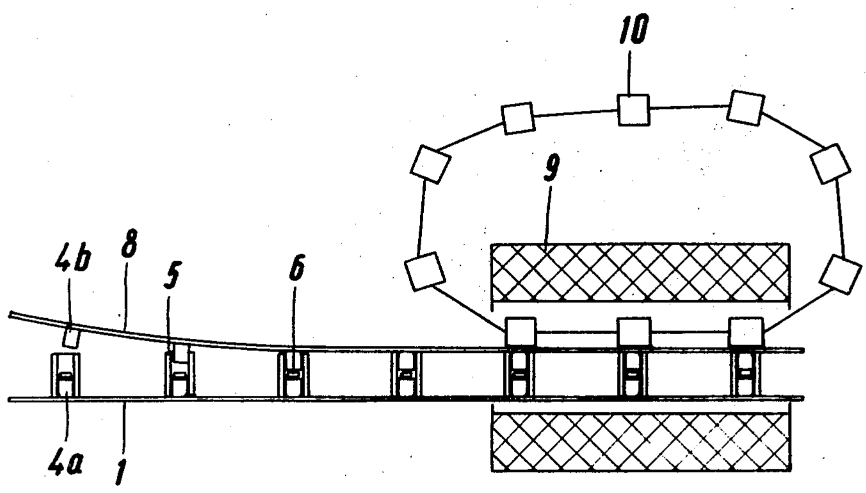
FIG. 3 shows how the two contact-making strips are brought together and the housings closed in a vacuum-tight manner.

According to FIG. 3, the two contact-making strips illustrated in FIGS. 1 and 2 are now placed one over the other in such a manner that the contacts 4*b* of the strip 8 are introduced into the housing member 5 (FIG. 1) and placed on the semiconductor chips disposed inside the interior of the housing. In this manner, the second region of the semiconductor chip is also provided with an electrode which serves as a heat sink at the same time. The cross section of the contacts is selected such that they either do not project only slightly beyond the semiconductor chips present between them.

The contact-making strips which have been brought together are conveyed through a continuous-heating furnace 9, the internal temperature of which is selected so high that the housing member begins to melt on to the contacts in a vacuum-tight manner. In order to ensure a satisfactory electrical contact between the contacts and the intervening semiconductor body during this closing process of the housing, a weighting chain 10 presses against the upper contact-making strips in the continuous-heating furnace. The temperature in the continuous-heating furnace may be about 760° C. for example.

After the melting of the glass housing, the tongues 2 are parted off from the webs of the contact-making strips and so the components are separated, the tongues 2 serving as electrodes or at least as parts of electrodes.

Figure 4:
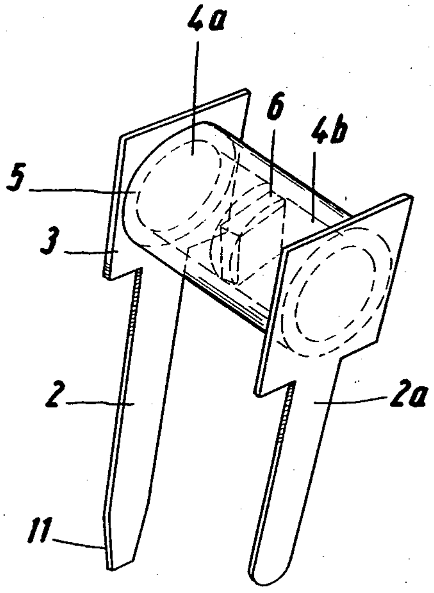
FIG. 4 illustrates a finished semiconductor diode with double-sided heat dissipation.

The finished semiconductor device is illustrated in FIG. 4. Between two contacts 4*a* and 4*b* which are disposed coaxially, there is a semiconductor wafer 6 which is pressed firmly against the contacts at both sides. The two strip-shaped electrode leads 2 and 2*a* extend parallel to one another and perpendicular to the axial direction of the contacts. One of the electrode leads 2 is longer than the other in order to distinguish the cathode of the diode. The electrode leads preferably become narrower at their free end 11. In this manner, the semiconductor devices produced according to the invention can easily be introduced into recesses in a printed circuit board and connected to the electrical conductors there. During the introduction of the leads into corresponding recesses in a circuit board, the point at which the leads become broader serves as a stop by means of which the leads are prevented from penetrating further into the recesses and so the structural height is determined.

The use of contact-making strips on which a plurality of semiconductor components are produced as above described has the considerable advantage that manufacture can be carried out fully automatically because the spacing between the individual units is always precisely equal.

It is obvious that the method according to the invention can be carried out with one contact-making strip if different parts of the contact-making strip can be folded together. In this case, contacts only may be secured to one side of the double comb contact-making strip for example, while contacts, housing members and semiconductor chips are assembled at the other side of the comb. Then one side of the comb is folded over the other side of the comb so that the semiconductor device illustrated in FIG. 4 is formed after the individual tongues have been parted off from the web common to both sides of the comb.

It will be understood that the above description of the present invention is susceptible to various modifications changes and adaptations.

What I claim as new and desire to secure by Letters Patent of the United States is:

1. A method of producing semiconductor devices, comprising the steps of securing first contacts in series to tongues or rungs of a contact-making strip, inverting housing members over said contacts and providing a semiconductor body on each said contact in said housing members, and finally introducing a second contact, which is secured to a further portion of a contact-making strip, into each said housing member to connecting said second contact to said semiconductor body.

2. A method as defined in claim 1, further comprising closing each said housing while holding said first and second contacts in contact with said semiconductor body and parting off said tongues or rungs carrying said contacts from said contact-making strips for use as at least part of electrode leads.

3. A method as defined in claim 2, wherein cylindrical wire lengths which draw off heat generated in said semiconductor body are used as said contacts.

4. A method as defined in claim 3, wherein said cylindrical lengths of wire comprise copper sheathed wire with an iron-nickel core.

5. A method as defined in claim 3, wherein cylindrical hollow bodies having their internal diameter at least as large as the diameter of the said contacts are used as housing members.

6. A method of producing semiconductor devices comprising the steps of securing first contact to each tongue of a first double comb structure contact-making strip, inverting a housing member over each said contact, placing a semiconductor body on each said contact in each said housing member, securing a second contact to each tongues of a second double comb structure contact-making strip, placing said first and second contact-making strips one over the other so that said second contacts are introduced into an associated one of said housing members to connect said second contacts to said semiconductor bodies.

7. A method as defined in claim 5, wherein said tongues of said double comb structure contact-making strips are of strip-shaped construction and are widened out in a flat portion at their free ends, said contacts being provided on said flat widened portions leaving the narrower strip-shaped tongues as electrode leads.

8. A method as defined in claim 7, wherein said contacts are welded on to said flat widened portions of said double comb structure contact-making strips.

9. A method as defined in claim 8, wherein said housing members consist of glass tube.

10. A method as defined in claim 9, wherein said first and second double comb structure contact-making strips are heated while assembled in a continuous-heating furnace, to a temperature at which said housing member begins to melt on to said contacts so to cause said housing to surround said semiconductor body in a vacuum-tight manner.

11. A method as defined in claim 10, wherein said double comb structure contact-making strips consist of gold-plated sheet material selected from the group consisting of iron, nickel and Vacon.

12. A method as defined in claim 10, wherein said contacts consist of copper-sheathed wire with an iron-nickel core.